United States Patent [19]

Evans

[11] Patent Number: 4,612,533

[45] Date of Patent: Sep. 16, 1986

[54] HARMONIC DISTORTION REDUCTION TECHNIQUE FOR DATA ACQUISTION

[75] Inventor: William P. Evans, Glen Burnie, Md.

[73] Assignee: The United States of America as represented by the Secretary of the Air Force, Washington, D.C.

[21] Appl. No.: 743,853

[22] Filed: Jun. 12, 1985

[51] Int. Cl.⁴ .............................................. H03M 1/10
[52] U.S. Cl. ............................... 340/347 CC; 364/571
[58] Field of Search ................. 340/347 CC, 347 AD, 340/347 NT, 347 SY; 364/571

[56] References Cited

U.S. PATENT DOCUMENTS

| | | | |
|---|---|---|---|
| 3,891,984 | 6/1975 | Kerwin et al. | 340/347 CC |
| 4,070,665 | 1/1978 | Glennon et al. | 340/347 SY |
| 4,340,882 | 7/1982 | Maio et al. | 340/347 CC |
| 4,393,371 | 7/1983 | Morgan-Smith | 340/347 AD |
| 4,410,876 | 10/1983 | Sawagata | 340/347 CC |
| 4,423,408 | 12/1983 | Place | 340/347 NT |
| 4,544,917 | 10/1985 | Lenhoff | 340/347 AD |

OTHER PUBLICATIONS

IBM Technical Disclosure Bulletin vol. 16, No. 9, Feb. 1974.

*Primary Examiner*—Charles D. Miller
*Attorney, Agent, or Firm*—Donald J. Singer; William G. Auton

[57] ABSTRACT

An analog to digital converter (ADC) is presented which uses a calibration technique to reduce harmonic distortion in data acquisition systems. This mechanization also allows faster conversion rates than previously possible for high resolution analog-to-digital converters. This converter makes use of a subrange or "half Flash" architecture where the subrange digital-to-analog converter (DAC) is augmented with a software calibrated DAC which removes system nonlinearities. The advantage of this system is that it allows the building of higher speed data acquisition systems with higher spurious free dynamic range than would be possible with conventional techniques. By adding the correction to the input of the subrange ADC, correction resolution can be a fraction of a quanta. A second approach using the same mathematics places at the output of the ADC a RAM or ROM look up table which linearizes the transfer function.

7 Claims, 2 Drawing Figures

HARMONIC DISTORTION REDUCTION TECHNIQUE FOR DATA ACQUISTION

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to analog-to-digital (A/D) converters, and specifically to a calibration system to remove system nonlinearities in digitally corrected subranging A/D converters.

In order to build faster data acquisition systems, it is necessary to use circuitry which does not employ feedback techniques which slow the circuit. A good example of non feedback data acquisition circuits are the new high speed sample and hold circuits sold by commercial hybrid houses today. The much greater speed of these parts is paid for by higher harmonic distortion. In systems where extremely high, spurious free, dynamic range is required, these harmonics are generally the limiting factor. The problem is therefore to build a data acquisition system which operates at the high conversion rates needed in modern communications and radar systems while simultaneously maximizing the spurious free, dynamic range.

Various techniques and systems have been utilized to increase the conversion speed in A/D converters, so that they can be effectively used in data acquisition systems. Analog-to-digital converters can usually be classified into groups. One group includes high speed parallel converters in which the several digital bits are formed more or less simultaneously. The high speed of operation is obtained here at significant expenditures. The converters of the second group operate by successive approximation; progressively synthesized analog equivalents of progressively formed digital signals are compared individually with the analog information signal. Unfortunately, in both groups, a tradeoff must be made between conversion speed and conversion precision in the design of conventional subranging A/D converters.

The task of improving the conversion speed while minimizing the loss of precision has been alleviated, to some degree, by the following U.S. Patents, which are incorporated herein by reference.

U.S. Pat. No. 3,891,984 issued to Kerwin et al on June 24, 1975;

U.S. Pat. No. 4,070,665 issued to Glennon et al on Jan. 24, 1978;

U.S. Pat. No. 4,340,882 issued to Maio et al on July 20, 1982; and

U.S. Pat. No. 4,393,371 issued to Morgan-Smith on July 12, 1983.

The Kerwin et al and Morgan-Smith references both disclose A/D conversion systems. The Kerwin et al A/D converter provides subranging and multiple level error correction with comparison circuits. The Morgan-Smith A/D converter contains the sample and hold circuits, mentioned above, to sample and store the analog signal so that the stored signal can be compared to the varying levels of the input signals.

The Glennon et al and Maio et al references both disclose digital-to-analog (D/A) converter (DAC) systems. The patent of Maio et al discloses a D/A conversion system with a memory for storing compensation data that is used to compensate the output of the D/A converter at an address corresponding to the digital input signal. Glennon et al show another digital-to-analog converter which uses a ROM programmed to generate a correction signal for the converter.

The application of digitally corrected subranging in A/D converters can be enhanced if the digital correction is used in the form of a software calibrated DAC to calibrate the subrange and remove the system nonlinearities. The present invention is intended to apply this concept.

SUMMARY OF THE INVENTION

The present invention makes use of subrange or "half flash" architecture where the subrange DAC, in an A/D converter, is augmented with a software calibrated DAC as a calibration system to remove system nonlinearities and improve the conversion speed.

In one embodiment, the present invention entails a harmonic distortion reduction system which is applied to a conventional A/D converter, which contains: a main range encoder, a DAC, an operational amplifier (OP AMP), a subrange encoder, and an output buffer. The conventional subranging A/D converter functions as follows. The main range encoder quantizes the analog input signal to produce a digital word ($N_1$) which drives the DAC. The DAC output is subtracted from the original input signal, and the difference is amplified by the OP AMP. The OP AMP produces the composite signal (the unquantized portion of the original analog input signal plus the errors). The subrange encoder quantizes the composite signal to produce an output byte signal ($N_2$). Finally, the output buffer combines the digital word ($N_1$) from the main range encoder, with the output byte signal ($N_2$) from the subrange encoder to produce the A/D digital output signal.

The harmonic distortion reduction system calibrates the conventional subranging A/D converter, described above, to reduce system nonlinearities using: a test sine wave oscillator, an analog multiplexer (analog MUX), a sample and hold circuit, a digital multiplexer (digital MUX), a random access memory (RAM), a correction DAC, and a micro processor (u processor). The harmonic distortion reduction system functions as follows. The analog MUX conducts three signals into the sample and hold circuit: a test sine wave signal from the test sine wave oscillator; an initial subrange alignment signal from the u processor; and all input analog signals received by the A/D converter for processing. The sample and hold circuit conducts all received analog signals from the analog MUX to the main range encoder (to be quantized) and to the OP AMP. The digital MUX produces a control address signal for the RAM by multiplexing the digital output signal from the main range encoder with an identification signal produced by the microprocessor. This control address signal simply allows the RAM to correctly match the address of an input analog signal with the correction values supplied to it by the microprocessor so that the RAM can output the correction values with their address to the correction DAC. The correction DAC produces an analog correction signal which is combined with: the input analog signal from the sample and hold circuit; and the output signal from the DAC in the A/D converter. This analog correction signal is input into the OP AMP of the A/D converter so that it can produce the corrected composite signal. The corrected composite signal from the OP AMP is then sent to the subrange encoder, which functions to produce a calibrated output byte signal ($N_2$).

The calibrated output byte signal ($N_2$) is combined by the output buffer with the digital word ($N_1$) from the main range encoder to produce the digital output signal of the A/D converter.

Note that the sine wave oscillator, mentioned above, is only used to initially calibrate the system. The microprocessor performs a fast Fourier transform (FFT) on the output of the main range encoder to produce the initial correction values in the RAM. The microprocessor performs an FFT on the A/D converter output when the calibration sine wave is switched in. Once the calibration values have been calculated, the sine wave is disconnected from the input and the calibration values are stored in the RAM. The microprocessor is not active after this has occured.

If a second calibration is required at a later time (due to temperature changes causing A/D transfer function to alter), the microprocessor becomes active, switches in the calibration sine wave, performs an FFT on the A/D output, and updates the calibration RAM. The microprocessor then switches out the sine wave and switches in the analog input. At this point the microprocessor becomes inactive until the new calibration is requested from some external source.

It is a principal object of the present invention to provide a harmonic distortion reduction system for data acquisition systems.

It is another object of the present invention to provide a self-calibrated analog-to-digital converter.

It is another object of the present invention to improve the conversion speed of analog-to-digital converters.

It is another object of the present invention to optimize the tradeoff between the conversion precision and conversion speed in analog-to-digital converters.

These together with other objects features and advantages of the invention will become more readily apparent from the following detailed description when taken in conjunction with the accompanying drawings wherein like elements are given like reference numerals throughout.

DETAILED DESCRIPTION OF THE PREFERRED EMBODIMENT

The present invention is a process and apparatus that includes a calibration system to remove system nonlinearities in digitally corrected subranging A/D converters.

Figure 1:
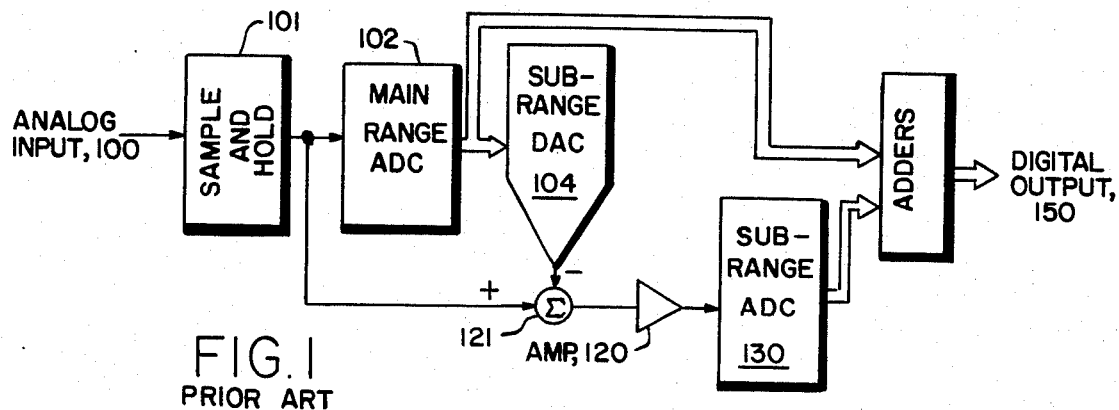
FIG. 1 is a block diagram of a conventional subranging A/D converter.

FIG. 1 is a schematic diagram of a conventional subranging A/D converter, which is presented to facilitate an understanding of the functions performed by the present invention. In FIG. 1, the analog input signal 100 is conducted by the sample and hold circuit 101 into the main range encoder 102 as well as the differencer 121 and amplifier 120.

The main range encoder 102 is labled as an ADC (analog-to-digital converter) because it quantizes the analog input signal 100 by converting it into a discrete set of values connected by step functions to produce a digital word signal ($N_1$). This digital word signal is not an exact digital equivalent of the analog input signal, since there exists an unquantized portion.

The subrange DAC 104 and differencer 121 help recover this unquantized portion as follows. The subrange DAC converts the digital word signal ($N_1$) back into an analog signal, where it is subtracted from the original analog input signal 100 by the differencer 121 and amplified by amplifier 120 to produce a composite signal. The composite signal is the unquantized portion of the original analog input signal plus system errors.

At this point, the subrange encoder 130 quantizes the composite signal to produce an output byte signal ($N_2$). This output byte signal ($N_2$) is then combined with the digital word signal ($N_1$) from the main range encoder 102 by adders 140, to produce the digital output signal 150.

Figure 2:
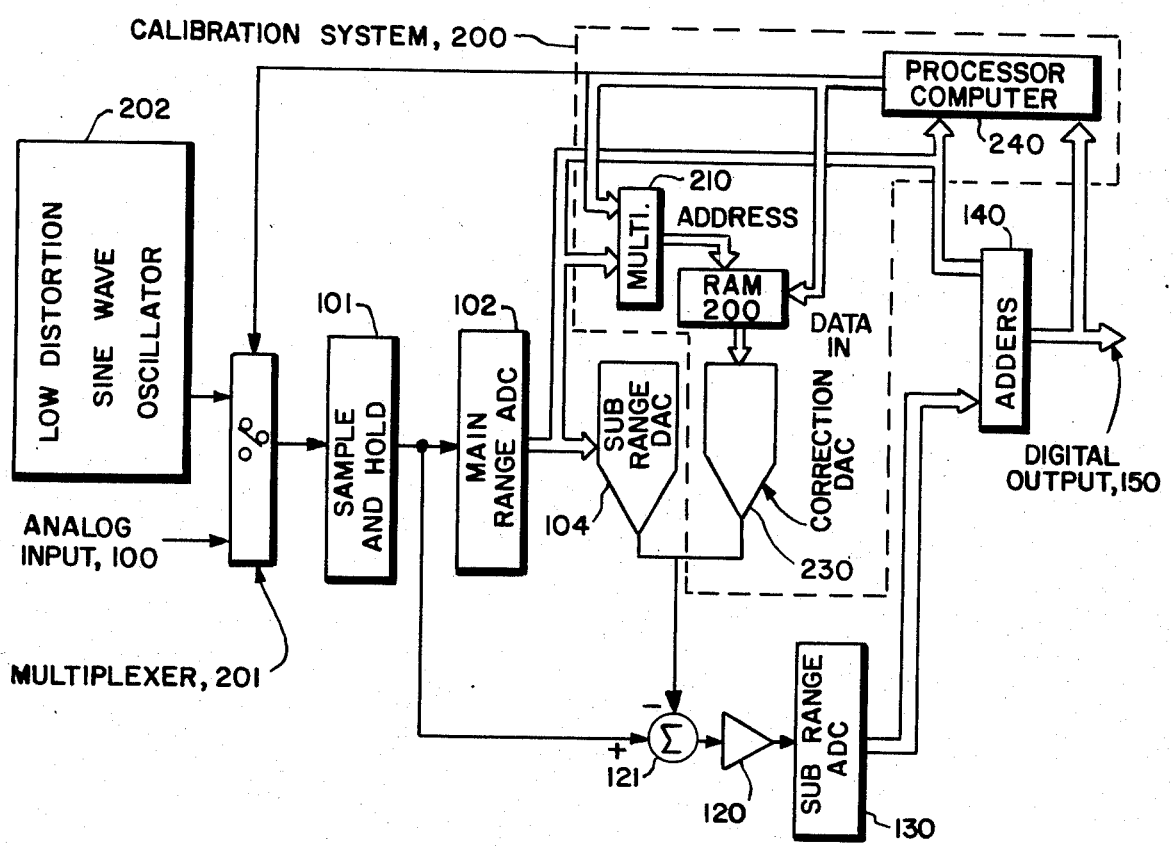
FIG. 2 is a block diagram of an embodiment of the calibration system of the present invention, as applied to the A/D converter of FIG. 1.

FIG. 2 is a schematic diagram of an embodiment of the present invention. In FIG. 2, a calibration system 200 of the present invention augments the conventional subranging A/D converter of FIG. 1 to remove system nonlinearities and improve the conversion rate/conversion precision tradeoff discussed earlier.

In FIG. 2, the analog multiplexer 201 conducts three signals into the sample and hold circuit 101: the analog input signal 100 (during operation); a test sine wave signal from the sine wave oscillator; and an initial subrange alignment signal from the processor-computer 240 (hereinafter referred to as the microprocessor 240).

The sample and hold circuit 101 conducts all received analog signals from the analog MUX 201 to the main range encoder 102 (to be quantized) and to the differencer 121. The digital MUX 210 produces a control address signal for the RAM 220 by multiplexing the digital word signal ($N_1$) from the main range encoder 102 with an identification signal produced by the microprocessor 240. This control address signal simply allows the REM 220 to correctly match the address of an input analog signal with the correction values supplied to it by the microprocessor 240 so that the RAM can output the correction values with their address to the correction DAC 230. The method of obtaining these corrections values is described in detail later.

The correction DAC 230 produces an analog correction signal which is combined with: the input analog signal from the sample and hold circuit 102; and the output signal from the subrange DAC 104. This analog correction signal is input into the differencer 121 of the A/D converter so that it can produce the corrected composite signal. The corrected composite signal from the amplifier 120 is then sent to the subrange encoder 130, which functions to produce a calibrated output byte signal ($N_2$).

The calibrated output byte signal ($N_2$) is combined by the adders 140 with the digital word ($N_1$) from the main range encoder 102 to produce the digital output signal 150 of the A/D converter.

The sine wave oscillator 202, mentioned above, is only used to initially calibrate the system. The microprocessor 240 performs a fast Fourier transform (FFT) on the output of the main range encoder 102 to produce the initial correction values in the RAM 220. The microprocessor 240 performs an FFT on the A/D converter output 150 when the calibration sine wave is switched in. Once the calibration values have been calculated, the sine wave is disconnected from the input and the calibration values are stored in the RAM 220.

The microprocessor 240 is not active after this has occured.

If a second calibration is required at a later time (due to temperature causing A/D transfer function to alter), the microprocessor 240 becomes active, switches in the calibration sine wave, performs an FFT on the A/D output, and updates the calibration RAM 220. The microprocessor 240 then switches out the sine wave and switches in the analog input. At this point the microprocessor 240 becomes inactive until the new calibration is requested from some external source.

In the present invention, the subrange digital-to-analog converter 104 shown in FIG. 1 is supplemented by a second parallel DAC 230 which is driven by a high speed RAM 220. The RAM 220 holds the linearity correction values and the address of the RAM is driven by the output of the main range analog-to-digital converter 102 (except when new values are being loaded in the RAM).

As mentioned above, in order to determine the correction values to be stored in the RAM, a low distortion, full scale, sine wave is switched to the input of the data acquisition system. The processor 240 performs an FFT on the output of the ADC and from the harmonics measured determines what correction values should be stored in the calibration RAM. What follows is a brief description of the mathematics needed to determine the correction values. The analysis given shows how to cancel the 2nd, 3rd, 4th, and 5th harmonics. Cancellation of higher order harmonics is easily done using the same techniques if required. For a linear data acquisition system $$E_0 = A_0 + A_1 X \qquad \text{Equation 1.}$$

Where 
 $E_0$ = Output of system
 $A_0$ = D.C. Offset
 $A_1$ = Gain Coefficient
 $X$ = Input to system (in volts)

A real system has a nonlinear transfer function which can be expressed in a power series as Equation 2:

$$E_0 = A_0 + A_1 X + A_2 X^2 + A_3 X^3 + A_4 X^4 + A_5 X^5 + \ldots$$

For discussion purposes this analysis is limited to the first six terms of the power series.

Substituting $\sin \omega t$ for X yields Equation 3:

$$E_0 = A_0 + A_1 \sin \omega t + A_2(\tfrac{1}{2} - \cos 2\omega t)) + A_3(\tfrac{1}{4}(3 \sin \omega t - \sin 3\omega t)) + A_4(\tfrac{1}{8}(3 - 4 \cos 2\omega t + \cos 4\omega t)) + A_5(1/16 (10 \sin \omega t - 5 \sin 3\omega t + \sin 5\omega t))$$

Now collecting the harmonic terms together yield Equation 5:

$$E_o = \underbrace{\left[A_0 + \tfrac{1}{2}A_2 = \tfrac{3}{8}A_4\right]}_{\text{D.C. Term}} + \underbrace{\left[A_1 + \tfrac{3}{4}A_3 + \tfrac{5}{8}A_5\right]}_{\text{Fundamental}} \sin\omega t -$$

$$\underbrace{\left[\tfrac{A_2}{2} + \tfrac{A_4}{2}\right]}_{\text{2nd Harmonic}} \cos 2\omega t \underbrace{\left[\tfrac{A_3}{4} + \tfrac{5}{16}A_5\right]}_{\text{3rd Harmonic}} \sin 3\omega t +$$

-continued $$\underbrace{\tfrac{A_4}{8}}_{\text{4th Harmonic}} \cos 4\omega t - \underbrace{\tfrac{A_5}{16}}_{\text{5th Harmonic}} \sin 5\omega t$$

Since $A_1$ is much greater than the other coefficients, the expression can be simplified to Equation 6:

$$E_0 = \text{offset} + A_1 \sin \omega t - 1[A_2 + A_4]\cos 2\omega t - [A_3 + (5/16)A_5]\sin 3\omega t + A_4 \cos 4\omega t - A_5 \sin 5\omega t$$

Let $H_2, H_3, H_4$, and $H_5$ be the size of the harmonics of the uncalibrated ADC as measured by the FFT. Note that the sign of $H_2$ through $H_5$ can be positive or negative depending on if the harmonics are in phase or 180° out of phase with the fundamental. This information is available when an FFT is calculated.

Now 
$$H_5 = \frac{-A_5}{16}$$

$$H_4 = \frac{A_4}{18}$$

$$H_3 = -\left[\frac{A_3}{4} + \frac{5}{16}A_5\right]$$

$$H_2 = -\left[\frac{A_2}{2} + \frac{A_4}{2}\right]$$

thus $A_5 = -16 H_5$ $A_4 = 8 H_4$ $$A_3 = -4\left(H_3 + \frac{5}{16}A_5\right) = -4(H_3 - 5H_5)$$

$$A_2 = -2\left(H_2 + \frac{A_4}{2}\right) = -2H_2 + 4H_4)$$

It is now possible to write the power series for the transfer function with the coefficients written in terms of the FFT harmonic outputs. The correction values stored in the calibration RAM are now simply calculated from the equation:

Correction value $= -A_2 X^2 - A_3 X^3 - A_4 X^4 - A_5 X^5$

One correction value is determined for each subrange of the analog-to-digital converter. The value of X is the voltage input corresponding to the center of each ADC subrange. The resolution of the correction values depend on the resolution of the correction DAC.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A self-calibrating analog-to-digital converter which receives an analog input signal and outputs a digital signal while reducing harmonic distortion, said self-calibrating analog-to-digital converter comprising:

a sample and hold circuit, which conducts analog signals;

a main range encoder, which produces a digital word signal ($N_1$) by quantizing analog signals received from said sample and hold circuit;

a subrange digital-to-analog converter which produces an output signal by receiving and converting into analog, said digital word signal from said main range encoder;

a digital calibration means, which receives the digital word signal ($N_1$) produced by said main range encoder, said digital calibration means outputting a digital harmonic distortion signal by extracting the harmonic distortion from the digital word signal ($N_1$) signal produced by said main range encoder;

a calibration digital-to-analog converter which produces an analog correction signal by receiving and converting to analog said digital harmonic distortion signal from said digital calibration means;

a differencing means which produces a corrected composite signal by subtracting said output signal received from said subrange digital-to-analog converter and said analog correction signal received from said calibration digital-to-analog converter, from analog signals received from said sample and hold circuit;

a subrange encoder which produces a calibrated output byte signal ($N_2$) by quantizing said corrected composite signal received from said differencing means; and a digital adding means which outputs said digital signal of said self-calibrating analog-to-digital converter by adding the digital word signal ($N_1$), received from said main range encoder, with said calibrated output byte signal ($N_2$), received from said subrange encoder.

2. A self-calibrating analog-to-digital converter, as defined in claim 1, wherein said digital calibration means comprises:

a data processor means which receives the digital word signal ($N_1$) produced by said main range encoder and the digital signal produced by said digital adding means, said data processor means producing a correction signal by extracting harmonic distortion components from the digital word signal ($N_1$) of said main range encoder, said data processor means also producing an identification signal which allows said correction signal to be identified with the digital word signal of said main range encoder;

a digital multiplexer which conducts said digital word signal ($N_1$) received from said main range encoder, said digital multiplexer also conducting said correction signal and said identification signal from said data processor means; and a memory means which receives signals from said digital multiplexer, said memory means outputting said digital harmonic distortion signal by identifying said correction signal from said data processor means with the digital word signal ($N_1$) from said main range encoder using the identification signal from said digital calibration means.

3. A self-calibrating analog-to-digital converter, as defined in claim 2, wherein said data processor means comprises:

a microprocessor which extracts harmonic distortion components from the digital word signal ($N_2$) of said main range encoder by performing a fast Fourier transform (FFT) on said digital signal produced by said digital adding means, expressing said harmonic distortion components in a power series; and collecting harmonic terms from the power series to produce said correction signal.

4. A self-calibrating analog-to-digital converter, as defined in claim 3, including a means for initially calibrating said self-calibrating analog-to-digital converter prior to its reception of external analog input signals, which are input for processing, said calibrating means supplying a test signal into said sample and hold circuit to allow said microprocessor to provide said memory means an initial set of correction signals which are used by said self-calibrating analog-to-digital converter to compensate for its system nonlinearities when said self-calibrating analog-to-digital converter processes said external analog input signals.

5. A self-calibrating analog-to-digital converter, as defined in claim 4, wherein said calibrating means comprises:

an oscillator which generates a low distortion, full scale, sine wave, which is used for initially calibrating said self-calibrating analog-to-digital converter, said oscillator ceasing to generate said sine wave once initial calibration is complete; and an analog multiplexer which is electrically connected to said oscillator and said sample and hold circuit, said analog mutiplexer conducting all analog signals received, including said sine wave, into said sample and hold circuit.

6. In combination with an analog-to-digital converter which has a transfer function and contains a main range encoder which quantizes input analog signal to produce an output signal, a digital-to-analog converter which receives said output signal of said main range encoder and produces on output analog signal, a subrange encoder which receives and quantizes said output analog signal from said digital-to-analog said output analog signal from said digital-to-analog converter to produce an output signal, and an adder which combines said output signals from said main range encoder and said subrange encoder to produce output digital signals that are approximately equivalent to said analog input signals, a process of calibrating said analog-to-digital converter, said process comprising the steps of:

extracting harmonic distortion signal components from the output signal of said main range encoder to produce digital correction values;

converting said digtal correction values into a correction analog signal;

combining said correction analog signal with the output analog signal of said digital-to-analog converter to produce a calibrated analog signal; and sending said calibrated analog signal to said subrange encoder to be processed in place of said output analog signal of said digital-to-analog converter.

7. A process, as defined in claim 6, wherein said extracting step comprises the following subsets:

performing a fast Fourier transform on the output signal of said analog-to-digital converter to obtain results;

converting the fast Fourier transform results to a power series representing the transfer function of the analog-to-digital converter;

determining the deviation of said transfer function from a straight line; and calculating said digital correction values from said deviation of said transfer function from said straight line.

* * * * *

UNITED STATES PATENT AND TRADEMARK OFFICE
CERTIFICATE OF CORRECTION

PATENT NO. : 4,612,533
DATED : 16 September 1986
INVENTOR(S) : William P. Evans

It is certified that error appears in the above-identified patent and that said Letters Patent is hereby corrected as shown below:

In the Title on Page 1, line 2, the word "ACQUISTION" should read --ACQUISITION--.

In the Background of The Invention on page 2, lines 1 and 2, the words "analog-to-digital" should read --analog-to-digital--.

Signed and Sealed this

Twenty-seventh Day of January, 1987

Attest:

DONALD J. QUIGG

Attesting Officer     Commissioner of Patents and Trademarks